United States Patent [19]
Wiegand et al.

[11] Patent Number: 4,484,090
[45] Date of Patent: Nov. 20, 1984

[54] PULSE GENERATOR WITH SHAPED MAGNETIC FIELD

[75] Inventors: John R. Wiegand, Valley Stream, N.Y.; John E. Opie, Stony Creek, Conn.

[73] Assignee: Echlin Manufacturing Company, Branford, Conn.

[21] Appl. No.: 336,730

[22] Filed: Jan. 4, 1982

Related U.S. Application Data

[63] Continuation-in-part of Ser. No. 123,703, Feb. 22, 1980, Pat. No. 4,309,628.

[51] Int. Cl.³ .............................................. H03K 3/45
[52] U.S. Cl. .................................... 307/419; 365/133
[58] Field of Search ......................... 365/133; 307/419

[56] References Cited

U.S. PATENT DOCUMENTS 4,263,523  4/1981  Wiegand ............................. 365/133
4,263,525  4/1981  Lathlaen ............................. 365/133

*Primary Examiner*—James W. Moffitt
*Attorney, Agent, or Firm*—McAulay, Fields, Fisher, Goldstein & Nissen

[57] ABSTRACT

A Wiegand wire module is excited by a non-uniform field, which may vary in time either symmetrically or asymmetrically, to provide a switch in state of the Wiegand wire thereby inducing a pulse in the pickup coil of the module. The non-uniform field has a maximum value in an axial direction at a center portion of the wire and a minimum value in an axial direction at end portions of the wire. As the amplitude of the field is varied to switch the wire, the end portions of the wire remain in a field having a low axial magnitude. The result is an output pulse substantially greater than obtained through symmetric exitation using a uniform field.

4 Claims, 6 Drawing Figures

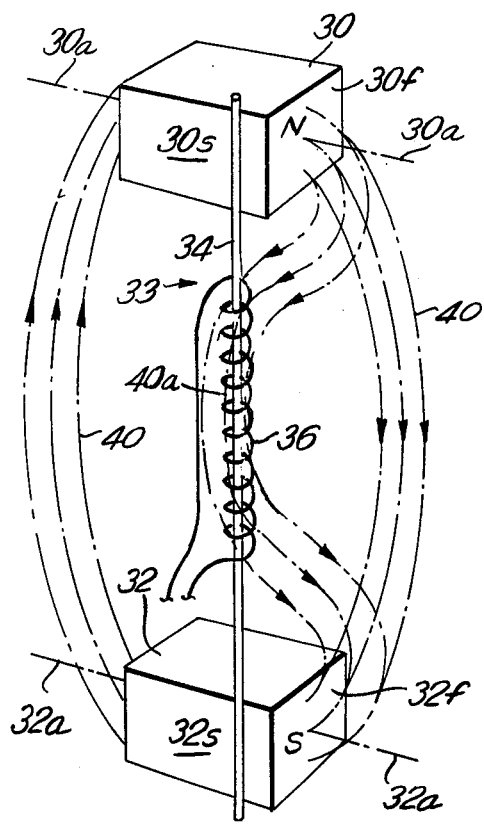
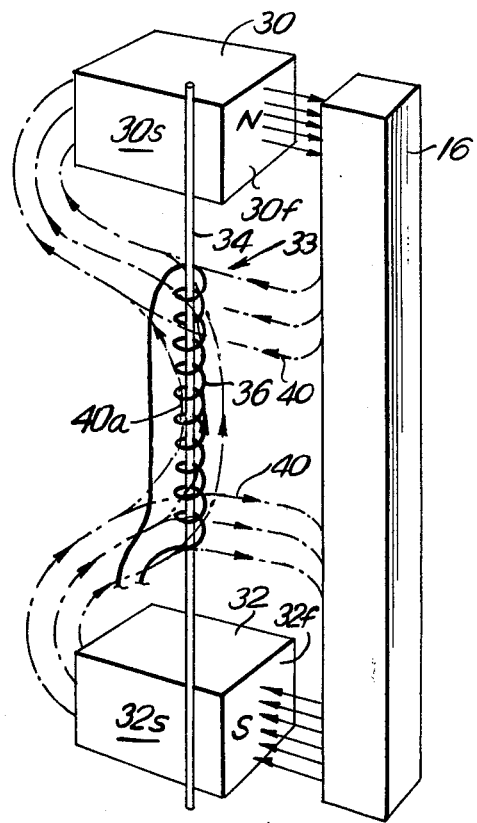
FIG.3                FIG.4
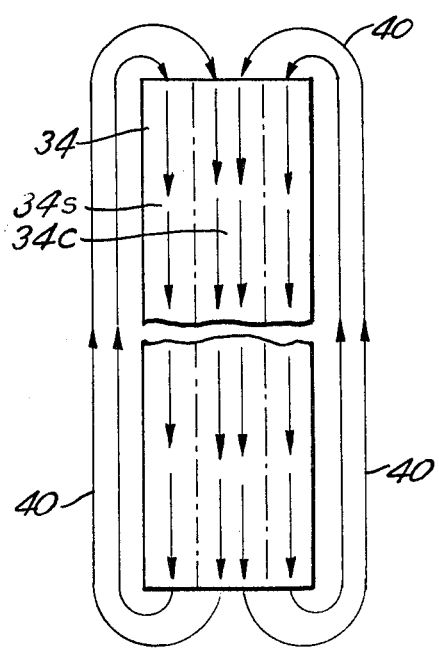
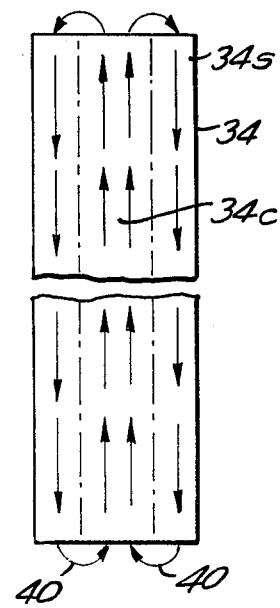
FIG.5                FIG.6

PULSE GENERATOR WITH SHAPED MAGNETIC FIELD

REFERENCE TO RELATED APPLICATION

This application is a continuation-in-part of copending application Ser. No. 123,703 filed Feb. 22, 1980 now U.S. Pat. No. 4,309,628 and having the title, Pulse Generation By Changing Magnetic Field.

BACKGROUND OF THE INVENTION

This invention relates in general to a mechanism for generating a pulse by switching the state of a magnetic device that has come to be known as a Wiegand wire and more particularly to a mechanism and method for affecting the magnetic field to which a Wiegand wire module is subjected so as to provide a reliable and repeatable output pulse upon the occurrence of a predetermined event.

The magnetic device employed in the pulser of this invention is of the type disclosed in U.S. Pat. No. 3,820,090 issued June 25, 1974. A preferred embodiment of this magnetic device is disclosed in U.S. Pat. No. 4,247,601 issued Jan. 27, 1981 to John R. Wiegand and entitled "Switchable Magnetic Device and Method of Manufacturing Same". These magnetic devices are ferro-magnetic wire segments which have been treated in such a fashion as to provide core and shell portions with divergent magnetic properties. This type of wire has come to be known in the art as Wiegand wire.

The Wiegand wire essentially has two states. In one of these states, the magnetization of the core and shell are in opposite directions and this state may conveniently be called a reverse state. In the other state, the magnetization of the core and shell are in the same direction and this state may conveniently be called the confluent state. When the magnetic field to which the wire is subjected passes a threshold in one direction or the other, the wire switches state. The switch in state is extremely rapid so that the rate of change of flux through a pickup coil wrapped around the wire is great. As a consequence the output from the pickup coil is very substantial, in some cases being as high as eight volts into an open circuit on a repeatable basis. The wire and pickup coil is referred to as a module.

The characteristics of a pulse generator which are desirable include simplicity, low cost, versatility, repeatability, reliability and high output pulse. There are inevitably certain trade-offs in enhancing certain of these characteristics at the expense of other characteristics. However, it is desirable to provide an optimum combination of these characteristics with whatever enhancement of the characteristics may be achieved to improve design and such is the general purpose of this invention.

More particularly, this invention is directed to the providing of a switching magnetic field configuration that has been found to enhance the magnitude of the output signal provided in a pick-up coil wrapped around the Wiegand wire. This invention is also directed to achieve this result by means of a simple motive arrangement that avoids complex mechanisms.

BRIEF DESCRIPTION

In brief, in one embodiment of this invention, a stationary pulser unit has first and second spaced apart magnets which are aligned with one another so that their axes of magnetization are parallel to one another but opposite in direction. These two magnets are small high strength magnets made of an alloy such as samarium cobalt. Thus, they establish a relatively intense field between them. The Wiegand wire module, which is essentially a Wiegand wire segment around which a pickup coil is wound, is positioned within the field between the two magnets. The outwardly facing north pole face of one of the two magnets and the outwardly facing south pole face of the other of the two magnets essentially define the plane of a working surface. The module is placed in the field such that the axis of the wire segment is orthogonal to the axis of the magnets and is adjacent to and parallel to the working surface of the magents and also adjacent to and parallel to a side of each of the magnets.

When a low reluctance element is brought adjacent to and parallel to this working surface, a substantial change in the configuration of the magnetic field between the two magnets occurs and, in particular, the axial component of the magnetic field through the Wiegand wire module reverses direction to switch the state of the wire and to induce a pulse in a pick-up coil wound around the Wiegand wire.

Significantly, the Wiegand wire in the module extends past the pick-up coil so that the wire ends are adjacent to the side of the two magnets and are in a field that has substantially no component axial to the wire, although the field does have a component transverse to the ends of the wire.

A minimal axial field at the ends of the wire assures that the demagnetization field at the ends of the wire is minimized and the magnetic state at the ends of the wire is controlled by the applied field. It has been observed that under these conditions the flux switched (when the field is reversed and passes through the switching threshold level) is larger and more rapid than it would be for the same field cycle where the field is uniform along the length of the wire. As a consequence, the output pulse is substantially increased.

BRIEF DESCRIPTION OF THE FIGURES

FIG. 3 is a schematic illustration showing the relationship between the two magnets and the Wiegand module within the pulser unit of FIG. 1 and approximately indicating the field configuration.

FIG. 4 is a schematic illustration similar to that of FIG. 3 except that in FIG. 4 the field configuration is sketched in as it might appear when one of the protrusions of FIG. 1 is adjacent to the working face of the pulser.

FIGS. 5 and 6 are schematic illustrations of the Wiegand effect exhibiting wire illustrating flux arrangement when in the confluent state (FIG. 5) where core and shell magnetization are in the same direction and when in the reverse state (FIG. 6) where core and shell magnetization are in the opposite directions.

DESCRIPTION OF THE PREFERRED EMBODIMENTS

Figure 1:
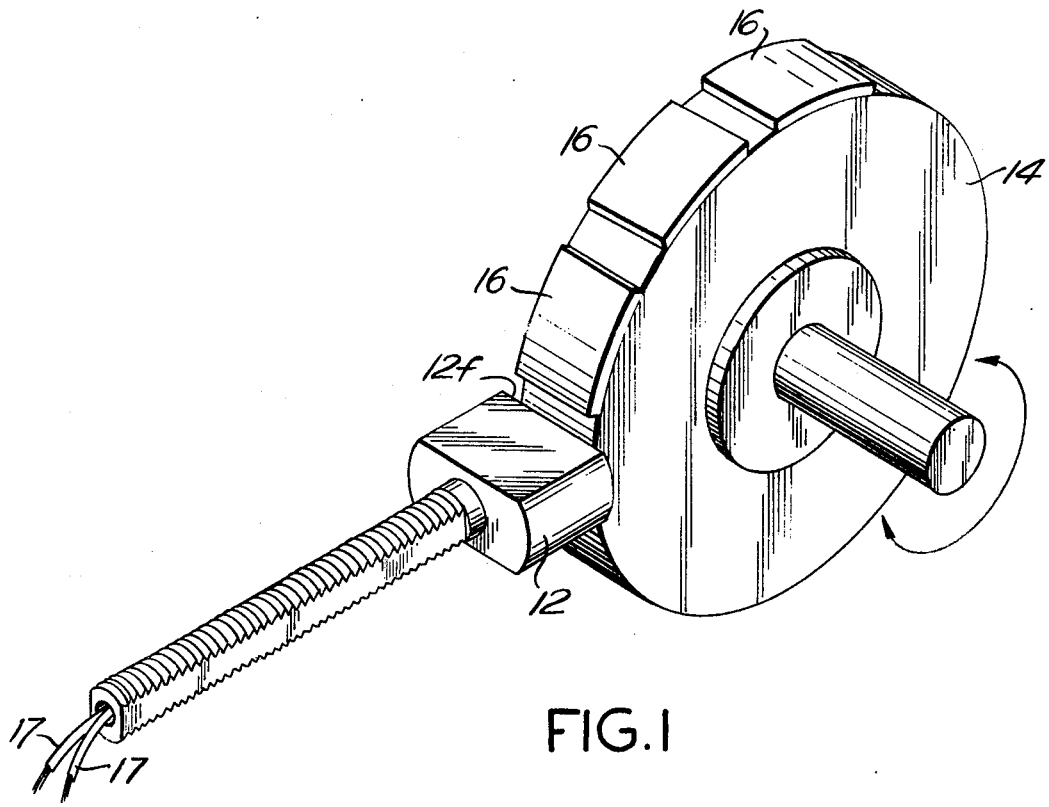
FIG. 1 is a perspective view of one embodiment of the invention in which the pulser element is pulsed by proximity to ferrous protrusions on the cylindrical surface of a rotating non-ferrous drum.
Figure 2:
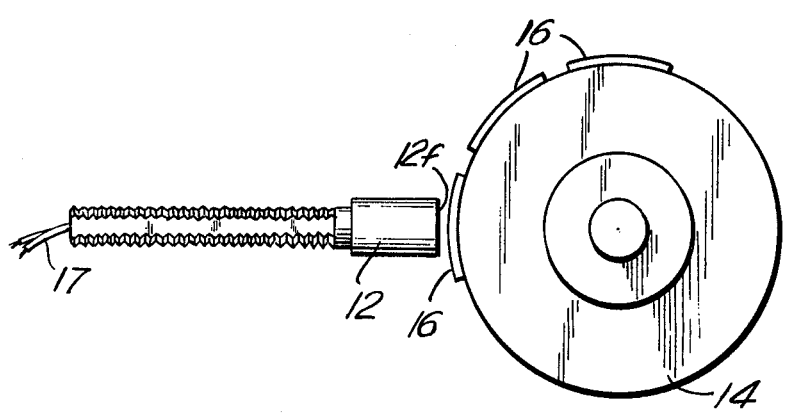
FIG. 2 is a cross-sectional view along the plane 2—2 through the FIG. 1 device illustrating the relative size and spacing involved.

FIGS. 1 and 2 illustrate a pulse generator embodiment which employs a pulser unit 12. Other embodiments are illustrated in the co-pending application referred to above. An electromagnetic schematic of the pulser unit 12 is shown in FIGS. 3 and 4.

In FIG. 1 the working face of the pulser 12 is deployed adjacent to the cylindrical surface of a rotating drum 14. The drum 14 is a non-ferrous material on the circumference of which a plurality of ferrous low reluctance elements 16 are deployed as protrusions. As the drum 14 rotates, the working face 12f of the pulser 12 alternately is adjacent to a ferrous zone, defined by one of the elements 16, and a non-ferrous zone, which is essentially the open space between the elements 16. The spacing between the low reluctance elements 16 in the FIG. 1 device should be at least equal to the width of the effective working surface of the pulser 12. The existence of this ferrous (also called ferro-magnetic) material 16 provides a low reluctance path causing the flux configuration generated by the magnets within the pulser 12 to materially distort and thereby change the magnetic field which influences the Wiegand wire. This is discussed in further detail in connection with the discussion of FIGS. 3 and 4. Suffice it to say for now that the magnetized Wiegand wire in the pulser 12 alternatives between confluent state and reverse state as the alternate ferrous protrusions 16 and spacings are presented to the working face of the pulser 12. The resultant field change is sensed by a pickup coil to generate a pulse on the output leads 17.

As shown in FIG. 2, the gap between the pulser 12 and the low reluctance elements 16 at their closest is kept small so that the effect of the elements 16 on distorting or modifying the magnetic field is as substantial as possible. In one embodiment, this gap between low reluctance elements 16 and the working face 12f is approximately 1.3 millimeters. This air gap, although small, is sufficiently great so as not to require expensive design to maintain tight tolerances thereby keeping construction costs of the system reasonable for a wide variety of application.

The operation of the pulser 12 can better be understood by reference to the electric and magnetic schematic illustrations in FIGS. 3 and 4. Two high energy magnets 30 and 32 are spaced from one another and in alignment such that their polar axes 30a, 32a are essentially parallel and such that a north pole face 30f of the first magnet and a south pole face 32f of the second magnet define the working surface 12f. In one embodiment, samarium cobalt magnets 30 and 32 are employed; each magnet being a bit over 6 millimeters long and being a bit over 3 millimeters on a side. They have a center-to-center spacing of approximately 13 millimeters and thus establish a strong magnetic field between them.

A Wiegand wire module 33 comprising essentially a length of Wiegand wire 34 around which a pickup coil 36 is wrapped is deployed in the magnetic field generated by the two magnets 30, 32. The module 33, in the illustrated embodiment, is deployed so that it is behind the working surface 12f and is adjacent to and substantially parallel to both the working surface 12f and to the sides 30s, 32s of the magnets 30, 32. The wire 34, positioned adjacent to one side of each of the two magnets, in one embodiment, has a length of approximately 20 millimeters thereby extending slightly past the outboard sides of the two magnets 30, 32. The magnitude of the air gap will affect to some degree the optimum position of the module 33 along the side of the magnets 30s, 32s.

The pickup coil 36 in that embodiment is wrapped around a 12 millimeter central portion of the wire 34 and is constituted by 1,350 turns of No. 44 copper wire. This embodiment produces an output pulse on the leads 17 that is consistently and reliably greater than one volt when applied to a 2,000 ohm load, specifically the base of a transistor. Laboratory measurements show the open circuit output to be three and one-half to four volts and thus consistently meeting a specification requirement of one volt. The Wiegand wire 34 is not in physical contact with the two magnets but spaced from their sides by a small distance of 2.5 millimeters.

The flux lines illustrated in FIGS. 3 and 4 are somewhat simplified to represent the situation that is believed to exist and which has been partially substantiated by recent measurements that have been made of the flux pattern along the length of the Wiegand wire 34 as the low reluctance element 16 is moved between positions adjacent to and removed from the working face of the pulser. As shown in FIG. 3, the flux lines that extend between the two magnets 30, 32 include a component 40a which passes in a first direction substantially axially along the center portion of the module 33. These flux lines 40a represent the fact that the external field has a component applied along the axis of the module 33. When the low reluctance element 16 is brought adjacent to the working face of the pulser, as shown in FIG. 4, not only is the entire field generated by the two magnets 30, 32 changed and distorted materially, but as shown, the component of that field which is applied axially to the center portion of the module 33 reverses in direction. Thus, the field applied to the wire 34 reverses sufficiently to cause the wire 34 to change state.

Although the Wiegand wire 34 has been described elsewhere, a brief description is provided here to facilitate understanding of this disclosure. FIGS. 5 and 6 illustrate a wire segment that is excited by a uniform field, unlike the field shown in FIGS. 3 and 4. Thus the following discussion should be understood to suggest what happens in the center portion of the wire segment 34 in the FIGS. 3 and 4 embodiment.

The wire 34 has two magnetic states as schematically illustrated in FIGS. 5 and 6. The manner in which the wire 34 is manufactured as well as a discussion of the nature of these two states may be found in U.S. Pat. No. 4,247,601 supplemented by U.S. Pat. No. 3,820,090 issued June 25, 1974 to John R. Wiegand. The preferred form of the wire 34 for use in this module 33 is disclosed in the '601 patent. The wire 34 is a ferrous material such as the vanadium-cobalt-iron alloy or the nickel-iron alloy described in said patent. The wire 34 typically has a diameter of 0.25 millimeters.

When the wire 34 is subjected to a uniform exciting field of sufficient strength (for example 40 to 80 oersteds) it is magnetized and set into the state schematically indicated in FIG. 5. In this state, the entire wire segment 34 is magnetized in a single direction and this state is termed the confluent state. When the energizing field is switched in direction to a level less than sufficient to switch the shell 34s (for example, minus 20 oersteds), then the wire 34 switches into its reverse state, schematically illustrated in FIG. 6. Accordingly, the flux generated by the relatively hard shell portion 34s is coupled through the relatively soft core portion 34c and the flux pattern changes from that shown in FIG. 5 to that shown in FIG. 6.

When the exciting field switches back to positive (for example, greater than 20 oersteds), the field reverts, and the wire 34 switches back into its confluent state (the state shown schematically in FIG. 5). This change in the magnetic state of the wire causes the flux generated by the shell portion 34s that was coupled through the core 34c to complete its path outside of the wire 34.

In both cases where the wire switches state, the direction of flux through the core reverses and can be sensed by a coil wrapped around the wire to generate an output pulse.

As shown in FIGS. 3 and 4, the module 33 is positioned adjacent to the sides 30s, 32s of the two magnets. The module 33 is also positioned adjacent and rearward of the working surface 12f. In one example, the output is optimized when the axis of the wire 34 is 1.5 millimeters back from the working surface 12f and 2.5 millimeters from the magnet sides 30s, 32s. For other air gaps and other materials (as well as for other size and shape elements, particularly the low reluctance element 16), the position of the module along the side of the magnet 30s, 32s will vary to obtain optimum results. The optimum position will have to be determined on a case by case basis.

Further, it has been observed that the positioning of the wire 34 so that its ends are in a zone of relatively low positive or negative magnetic field intensity tends to maximize the magnitude of the output pulse. It is believed that the influence of the demagnetization effect on the ends of the wire 34 is minimized if the external magnetic field applied to the ends of the wire can be kept as small in magnitude as possible. This results in a flux closure within the wire which is distributed over a longer length so that when the wire switches state, a larger and more rapid flux change occurs to provide an output pulse having greater magnitude.

It has also been observed that when the element 16 moves away from the wire, a pulse may or may not be obtained. Such is a function of how close the element 16 is brought to the working surface and may also be a function of how close the module 33 is to the working surface 30f, 32f.

U.S. Pat. No. 4,247,601 illustrates a module (having a Wiegand wire and pickup coil) which is subjected to an energizing field that is uniform along the length of the wire. That wire can be switched by temporally varying the magnitude of the field between a positive saturating value and some negative value. Where this field variation extends from a saturating positive field to a saturating negative field, for example between plus and minus 100 oersteds, two significant pulses are obtained representing a switch in the magnetization of the core under the influence of the negative field and a switch of the magnetization of the core under the influence of the positive field. This kind of excitation is termed symmetric excitation because the field swings approximately as far negative as it does positive. By contrast, in this spatially uniform excitation mode disclosed in the '601 patent, when the field is temporally asymmetric so that it swings negative by a relatively small amount (for example, minus 20 oersteds) and substantially positive, then the pulses obtained are quite different. The pulse resulting from the core switch due to the negative field tends to be very small in magnitude and the pulse obtained when the core switches due to the positive field is a very substantial output pulse. This asymmetric excitation is illustrated in FIG. 3 of the '601 patent. The symmetric excitation is illustrated in FIG. 5 of the '601 patent. The terms refer to symmetry or asymmetry in time.

By marked contrast is the situation under the non-uniform field arrangement illustrated in FIGS. 3 and 4 in which the ends of the wire 34 are subjected to a relatively small magnitude of axial fields. The nature of the switching is substantially different from that illustrated in the '601 patent. In particular, it has been found that when the low reluctance element 16 is moved inward toward the working face 30f, 32f a first pulse is generated which has a substantial and useful amplitude. If the element 16 is moved no further inward and is then retracted to a removed position, a second pulse will not be generated. However, if the low reluctance element 16 is moved further inward toward the working surface after the first pulse is generated and then moved back out to a removed position, a second significant pulse will be generated. This latter procedure is a symmetric type of excitation. In brief, employing this non-uniform field provides a single pulse under asymmetric excitation and a double pulse under symmetric excitation and the pulses under both modes of excitation are similar in magnitude.

What has been noted is that (with the same module operating into the same load circuit) the output pulse obtained by symmetric excitation using this non-uniform field provides a pulse output which is as much as five times as great as is provided by symmetric excitation with a uniform field. It has also been found that excitation by this non-uniform field provides an output pulse that is about 75 to 80 percent of the pulse obtained by asymmetric excitation using a uniform field.

What is claimed is:

1. A pulser for use in the generation of a pulse in response to a changing magnetic field comprising:
   a Wiegand wire,
   means to establish a magnetic field external of said wire,
   means to couple said field to a central portion of said Wiegand wire,
   means to vary the magnitude of the field coupled to the said central portion of said Wiegand wire sufficiently to cause a change of state of said wire as said magnitude of said field is varied,
   the configuration of said external field being such that the ends of said Wiegand wire are subjected to an external field of relatively minimal absolute magnitude in an axial direction when said wire switches state under the influence of said external field.

2. A pulse generator comprising:
   a pulser having a working surface, and a low reluctance element,
   said pulser and said element being movable relative to each other between positions adjacent to and removed from said working surface,
   said pulser including first and second spaced apart magnets determining a magnetic field therebetween and a Wiegand wire module positioned in said magnetic field between said first and second magnets, said magnets and module all being positioned rearward of said working surface,
   said Wiegand wire module including a Wiegand wire segment and a pickup coil wrapped around said wire, said first and second magnets having essentially parallel magnetic axes and opposite polarities, a first pole of said first magnet having a first polarity and a second pole of said second magnet having a second polarity, said first pole of said first magnet and said second pole of said second magnet substantially defining said working surface of said pulser, the permeability of said low reluctance element being sufficient to reverse the component of said magnetic field that is applied to said wire and that is parallel to the axis of said wire when the location of said element is switched between positions adjacent to and removed from said working surface, said Wiegand wire switching state in response to said reversal of said axial component of said field, the ends of said Wiegand wire being positioned in said field adjacent to the sides of said magnets in a place of relatively minimal field intensity along the axis of said wire.

3. The method of switching the state of a Wiegand wire comprising the step of:

applying an external field to said wire, said field having a substantial component parallel to the axis of said wire at the center portion of said wire, said field having a relatively minimal absolute magnitude along said wire axis at the end portions of said Wiegand wire, and varying the component of said field along said central portion of said wire to switch the state of said wire while maintaining a relatively minimal axial magnitude of said field along the ends of said wire.

4. A pulse generator comprising: a Wiegand wire module having a Wiegand wire segment and a pickup coil, means to establish a non-uniform energising magnetic field, the axial amplitude of said magnetic field varying along the length of said Wiegand wire from a maximum amplitude along a center portion of said wire to a minimum amplitude at end portions of said wire, means to temporally vary said magnitude of said field along said center portion of said wire through a switching threshold magnitude to cause a change of state of said wire, the magnitude of said axial field at said end portion of said wire remaining substantially unchanged during said variation of said field at said central portion of said wire.

* * * * *